US 8,422,229 B2

(12) United States Patent
Madison, Jr. et al.

(10) Patent No.: US 8,422,229 B2
(45) Date of Patent: Apr. 16, 2013

(54) MOLDED HEAT SINK AND METHOD OF MAKING SAME

(75) Inventors: Carl T. Madison, Jr., Windsor, CO (US); John R. Kostraba, Jr., Broomfield, CO (US)

(73) Assignee: Oracle America, Inc., Redwood City, CA (US)

( * ) Notice: Subject to any disclaimer, the term of this patent is extended or adjusted under 35 U.S.C. 154(b) by 306 days.

(21) Appl. No.: 12/491,497

(22) Filed: Jun. 25, 2009

(65) Prior Publication Data

US 2010/0328892 A1    Dec. 30, 2010

(51) Int. Cl.
*H05K 7/20* (2006.01)

(52) U.S. Cl.
USPC ........... 361/702; 361/698; 361/699; 361/703; 361/710; 29/890.03

(58) Field of Classification Search .................. 361/698, 361/699, 702, 703, 710; 29/890.03
See application file for complete search history.

(56) References Cited

U.S. PATENT DOCUMENTS

| | | | | |
|---|---|---|---|---|
| 4,415,025 A * | 11/1983 | Horvath | ............... | 165/185 |
| 4,698,728 A * | 10/1987 | Tustaniwskyj et al. | ....... | 361/699 |
| 4,712,158 A * | 12/1987 | Kikuchi et al. | ............... | 361/699 |
| 5,006,924 A * | 4/1991 | Frankeny et al. | ............. | 257/714 |
| 5,144,531 A * | 9/1992 | Go et al. | ........................ | 361/702 |
| 5,285,347 A * | 2/1994 | Fox et al. | ....................... | 361/699 |
| 5,388,635 A * | 2/1995 | Gruber et al. | ................ | 165/80.4 |
| 5,829,516 A | 11/1998 | Lavochkin | | |
| 6,519,955 B2 * | 2/2003 | Marsala | ........................... | 62/119 |
| 6,536,510 B2 * | 3/2003 | Khrustalev et al. | ....... | 165/104.33 |
| 6,587,336 B2 * | 7/2003 | Chu et al. | .................. | 361/679.47 |
| 6,657,121 B2 * | 12/2003 | Garner | ......................... | 174/16.3 |
| 6,765,793 B2 * | 7/2004 | Kehret et al. | ................. | 361/690 |
| 6,992,382 B2 * | 1/2006 | Chrysler et al. | ............... | 257/717 |
| 7,003,970 B2 * | 2/2006 | Iida et al. | ..................... | 62/259.2 |
| 7,012,807 B2 * | 3/2006 | Chu et al. | ...................... | 361/699 |
| 7,017,655 B2 * | 3/2006 | Wilson et al. | ................. | 165/80.4 |
| 7,254,030 B2 * | 8/2007 | Chiba et al. | .................... | 361/710 |
| 7,508,669 B2 * | 3/2009 | Fonfara et al. | ................ | 361/699 |
| 2002/0007641 A1 * | 1/2002 | Marsala | ........................... | 62/119 |
| 2003/0010477 A1 * | 1/2003 | Khrustalev et al. | ....... | 165/104.33 |
| 2003/0168732 A1 * | 9/2003 | Benefield | ...................... | 257/716 |
| 2004/0226707 A1 * | 11/2004 | Sagal et al. | .................... | 165/185 |
| 2007/0274044 A1 * | 11/2007 | Fonfara et al. | ................ | 361/699 |
| 2008/0041566 A1 * | 2/2008 | Scott | ........................ | 165/104.33 |
| 2010/0211958 A1 * | 8/2010 | Madison et al. | ............. | 718/105 |
| 2011/0163427 A1 * | 7/2011 | James | ........................... | 257/670 |

OTHER PUBLICATIONS

Computer Cooling—Wikipedia, The Free Encyclopedia, http://en.wikipedia.org/wiki/Computer_cooling p. 1 of 15 thru p. 15 of 15, May 28, 2009.

* cited by examiner

*Primary Examiner* — Anatoly Vortman
(74) *Attorney, Agent, or Firm* — Brooks Kushman P.C.

(57) ABSTRACT

A heat sink for use with a heat generating component includes a molded cooling block including a molded cooling passage for receiving a cooling medium. The cooling block is configured to be positioned in sufficient heat transfer relationship with respect to the heat generating component so that the cooling medium receives heat from the heat generating component.

18 Claims, 6 Drawing Sheets

MOLDED HEAT SINK AND METHOD OF MAKING SAME

BACKGROUND OF THE INVENTION

1. Field of the Invention

The invention relates to heat sinks for cooling heat generating components.

2. Background Art

Heat sinks may be used to cool electronic devices for example. One known heat sink includes a copper or aluminum cooling block having cooling passages that are machined into the cooling block. The cooling passages receive a cooling liquid that receives heat from the electronic device.

SUMMARY

In accordance with an embodiment of the present disclosure, a heat sink for use with a heat generating component includes a molded cooling block including a molded cooling passage for receiving a cooling medium. The cooling block is configured to be positioned in sufficient heat transfer relationship with respect to the heat generating component so that the cooling medium receives heat from the heat generating component.

In accordance with another embodiment of the present disclosure, an electronic circuit assembly includes a circuit assembly body, and a molded cooling block attached to the circuit assembly body. The cooling block includes a molded cooling passage for receiving a cooling medium. Furthermore, the cooling block is positioned in sufficient heat transfer relationship with respect to the circuit assembly body so that the cooling medium receives heat from the circuit assembly body when the cooling medium is received in the molded cooling passage.

An exemplary method according to the present disclosure for making a heat sink for use with a heat generating component includes molding a material to form a cooling block that includes a molded cooling passage for receiving a cooling medium. The cooling block is configured to be positioned in sufficient heat transfer relationship with respect to the heat generating component so that the cooling medium receives heat from the heat generating component when the cooling medium is received in the molded cooling passage.

While exemplary embodiments in accordance with the invention are illustrated and disclosed, such disclosure should not be construed to limit the claims. It is anticipated that various modifications and alternative designs may be made without departing from the scope of the invention.

DETAILED DESCRIPTION

Several specific embodiments are set forth in the following description and in FIGS. 1-9 to provide a thorough understanding of certain embodiments according to the present disclosure. As those of ordinary skill in the art will understand, various features of the embodiments illustrated and described with reference to any one of the Figures may be combined with features illustrated in one or more other Figures to produce embodiments that are not explicitly illustrated or described. In addition, other embodiments may be practiced without several of the specific features explained in the following description.

Figure 1:
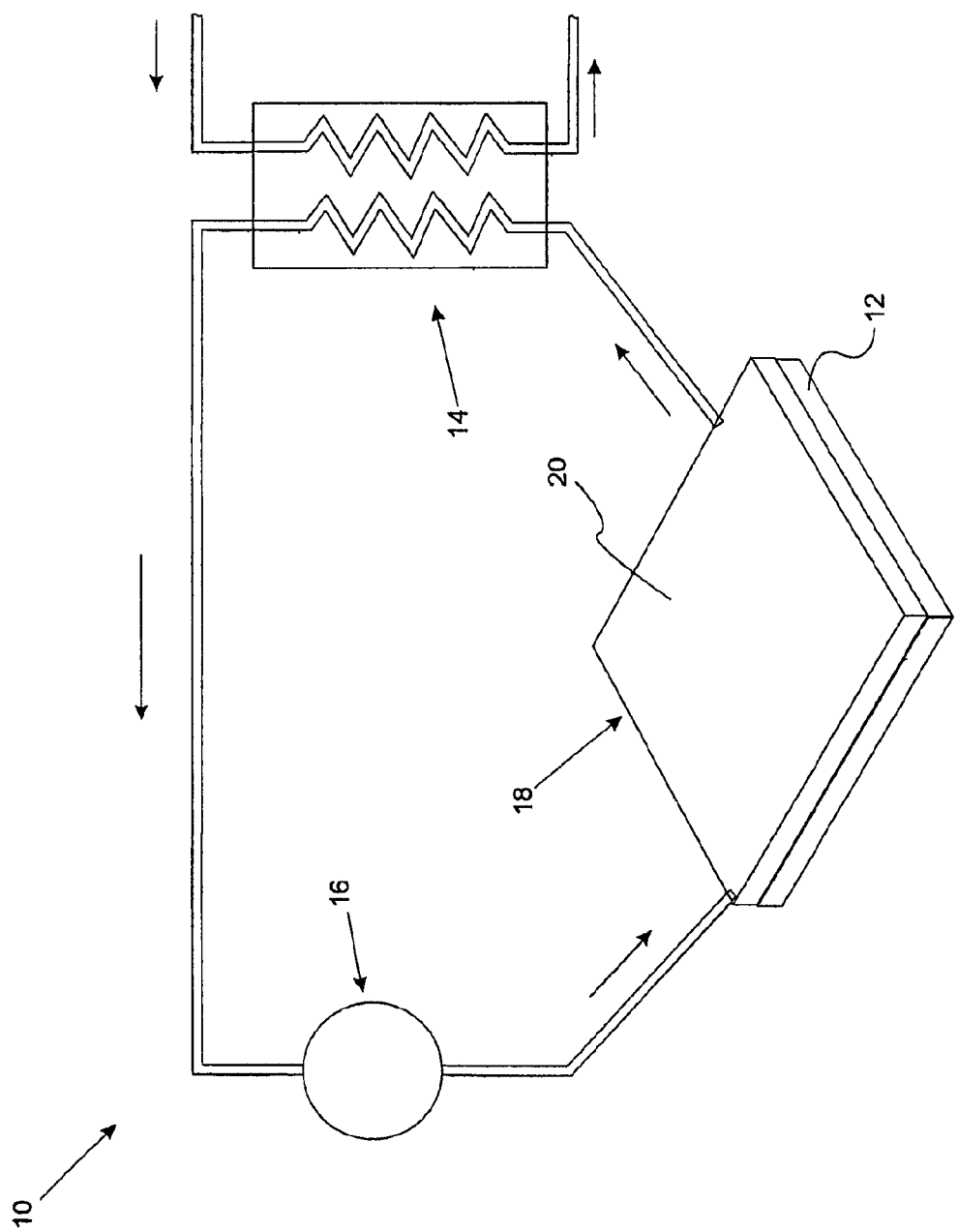
FIG. 1 is a schematic view of a cooling system for cooling a heat generating component, wherein the cooling system includes a molded cooling device or heat sink.

FIG. 1 shows a cooling system 10, such as a liquid cooling system, for cooling a heat generating component, such as an electronic device 12. The electronic device 12 may be, for example, an electronic circuit or circuit component, electric motor, power supply, etc. Furthermore, the electronic device 12 may be part of a computer system. The cooling system 10 may include a heat exchanger 14, a pump 16 and a liquid cooled cooling device, such as a heat sink 18, in accordance with the present disclosure.

Figure 2:
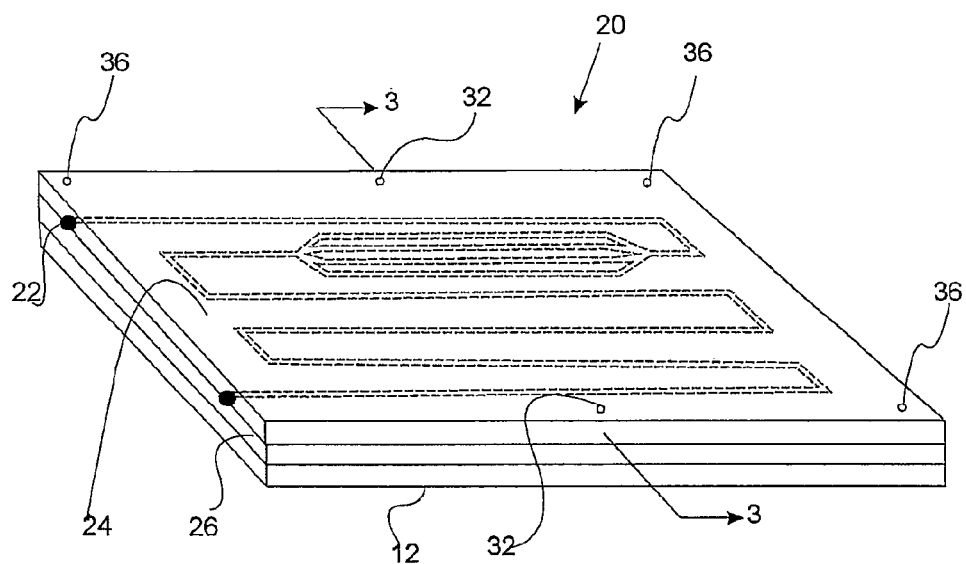
FIG. 2 is a perspective view of the heat generating component and heat sink of FIG. 1.
Figure 3:
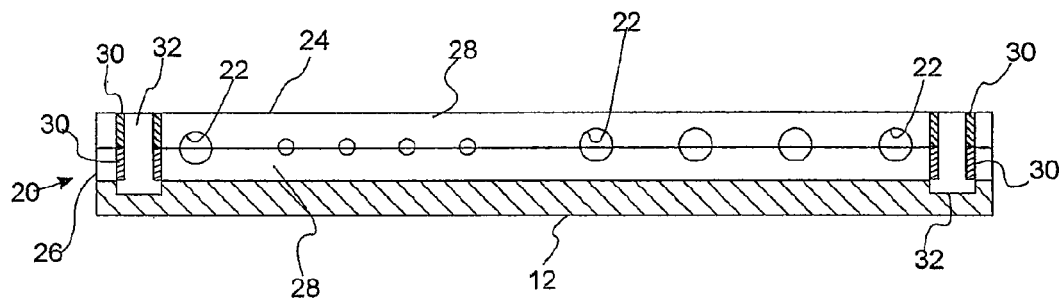
FIG. 3 is a cross-sectional view of the heat generating component and heat sink of FIG. 2.

Referring to FIGS. 1-3, the heat sink 18 includes a molded cooling block 20 having one or more molded cooling passages 22, such as channels, that receive a cooling medium, such as a cooling liquid supplied by the pump 16 for example. The cooling liquid may be any suitable liquid, such as water, ethylene glycol and/or mineral oil.

The cooling block 20 is configured to be positioned in sufficient heat transfer relationship with respect to the electronic device 12 so that the cooling liquid receives heat from the electronic device 12 as the cooling liquid passes through the passages 22. The cooling liquid may then be routed to the heat exchanger 14, where heat may be transferred from the cooling liquid to another suitable medium, such as chilled water or air.

In the embodiment shown in FIG. 1, the cooling block 20 is attached directly to the electronic device 12 to form an assembly. For example, the cooling block 20 may be attached to the electronic device with fasteners and/or adhesive. As another example, the cooling block 20 may be positioned in close proximity to the electronic device 12.

Furthermore, in the embodiment shown in FIGS. 2 and 3, the cooling passages 22 are formed entirely in the cooling block 20. With such a configuration, the cooling liquid remains spaced away from the electronic device 12 and does not come in contact with the electronic device 12. In other embodiments, cooling liquid or other cooling medium may directly contact an associated electronic device.

The cooling block 20 may be made of any suitable material and in any suitable manner. Under one example manufacturing method, the cooling block 20 may include two or more separate plastic pieces or sections, such as first and second sections 24 and 26, respectively (as shown in FIG. 2), that are each formed by an injection molding process or compression molding process. The sections 24 and 26 may then be subsequently sealed together, such as with fasteners, an adhesive and/or through a heat staking process.

Each section 24, 26 may at least partially define one or more of the passages 22. In the embodiment shown in FIGS. 2 and 3 for example, the first section 24 defines an upper portion of each passage 22, and the second section 24 defines a lower portion of each passage 22.

One or both of the sections 24, 26 may also be formed with one or more connecting members, such as alignment members and/or fastener members, that may be used to connect the sections 24 and 26 together and/or to connect the cooling block 20 to the electronic device 12. In the embodiment shown in FIGS. 2 and 3, for example, the sections 24 and 26 each include a molded body portion 28 and one or more alignment members 30, such as metal alignment receptacles, guides, or cylinders, that are insert molded with the body portion 28. More specifically, the alignment members 30 may be positioned in a suitable mold, and plastic material may be injected into the mold to form the body portion 28 such that the body portion 28 is attached to the alignment members 30. Furthermore, the alignment members 30 may receive corresponding alignment members 32, such as rods or posts, formed on the electronic device 12, in order to align one or both of the sections 24 and 26 with respect to the electronic device 12. In another embodiment, one or both of the sections 24 and 26 may be formed with rods or posts that are insert molded with the body portions 28 and that are received in corresponding receptacles, guides, or cylinders formed on the electronic device 12.

Figure 4:
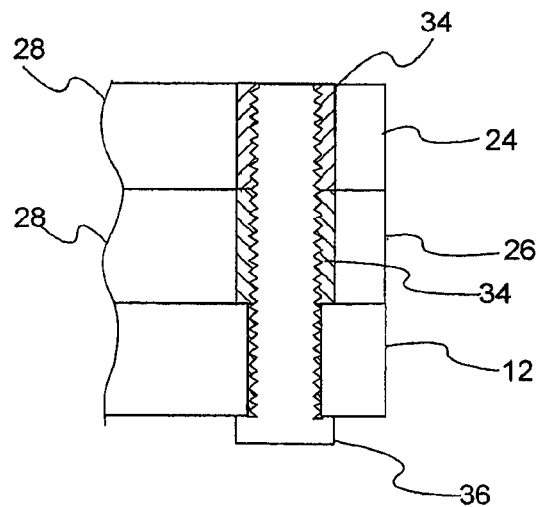
FIG. 4 is a fragmentary cross-sectional view of the heat generating component and heat sink of FIG. 3, showing fastener members for connecting the heat generating component and heat sink together.

Referring to FIGS. 3 and 4, each section 24 and 26 also includes one or more fastener members 34, such as threaded inserts, that are insert molded with the corresponding body portion 28. The fastener members 34 receive complementary fastener members 36, such as screws or bolts, that may be used to fasten the sections 24 and 26 together and/or to fasten the sections 24 and 26 to the electronic device 12.

Under another example manufacturing method, the cooling block 20 may be molded as a single piece. For instance, the cooling block 20 may be made from a castable material, such as epoxy resin or urethane, that is cast about a passage defining material, such as wax, which is formed in the desired size and shape of the cooling passages 22. After the cooling block 20 has been cast, the cooling block 20 may be sufficiently heated, for example, to melt the passage defining material so that the passages 22 are defined in the cooling block 20.

As yet another example, the cooling block 20 may be formed from molded glass, ceramic, metal or composite material, such as epoxy resin with aramid fibers and/or carbon fibers.

Because the cooling block 20 may be made from any suitable moldable material, the material for the cooling block 20 may be selected to match, complement or otherwise correlate to a material used to make the electronic device 12. For example, if the electronic device 12 is an integrated circuit board having a glass or ceramic substrate, the cooling block 20 may be made of the same or similar material, such that the coefficient of thermal expansion for the cooling block 20 may be the same as or similar to the coefficient of thermal expansion for the substrate of the electronic device 12. As a result, the cooling block 20 and the substrate of the electronic device 12 may expand and contract at the same or similar rates due to temperature changes.

Because the thermal expansion rates of the cooling block 20 and electronic device 12 may be the same or similar, wear and tear on the electronic device 12 due to temperature changes may be reduced.

In one embodiment, the coefficient of thermal expansion for the cooling block 20 may be in the range of 90% to 110% of the coefficient of thermal expansion for the substrate. In another embodiment, the coefficient of thermal expansion for the cooling block 20 may be in the range of 95% to 105% of the coefficient of thermal expansion for the substrate.

Furthermore, the cooling block 20 may be made in any suitable size and shape. For example, the cooling block 20 may have a generally planar body, such as shown in FIGS. 1-3. As another example, the cooling block 20 may have an annular shaped body so that it may be positioned around a complementary electronic device 12, such as a motor. Such a body may be made as one piece, or multiple ring-shaped pieces or arcuate segments that are attached together.

Figure 5:
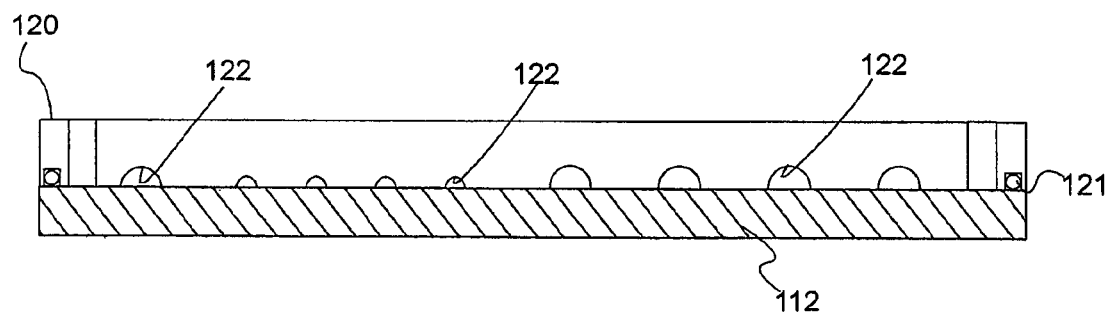
FIG. 5 is a cross-sectional view of another embodiment of a cooling device or heat sink in accordance with the present disclosure, wherein the heat sink is attached to a heat generating component to form an assembly.

FIG. 5 shows another embodiment of a heat generating component and heat sink assembly in accordance with the present disclosure, which may be used with the cooling system 10 for example. That embodiment includes an electronic device 112 sealed against a molded cooling block 120 such as with fasteners and/or an adhesive. The assembly may further include a seal member 121, such as a rubber seal, positioned between the electronic device 112 and the cooling block 120.

The cooling block 120 includes one or more molded cooling passages 122 that allow a cooling medium to directly contact the electronic device 112. For example, one or more of the cooling passages 122 may be open toward the electronic device 112, as shown in FIG. 5.

The cooling block 120 may be made of any suitable material and in any suitable manner. For example, the cooling block 120 may be made of any of the materials and by any of the methods described above with respect to the cooling block 20.

Figure 6:
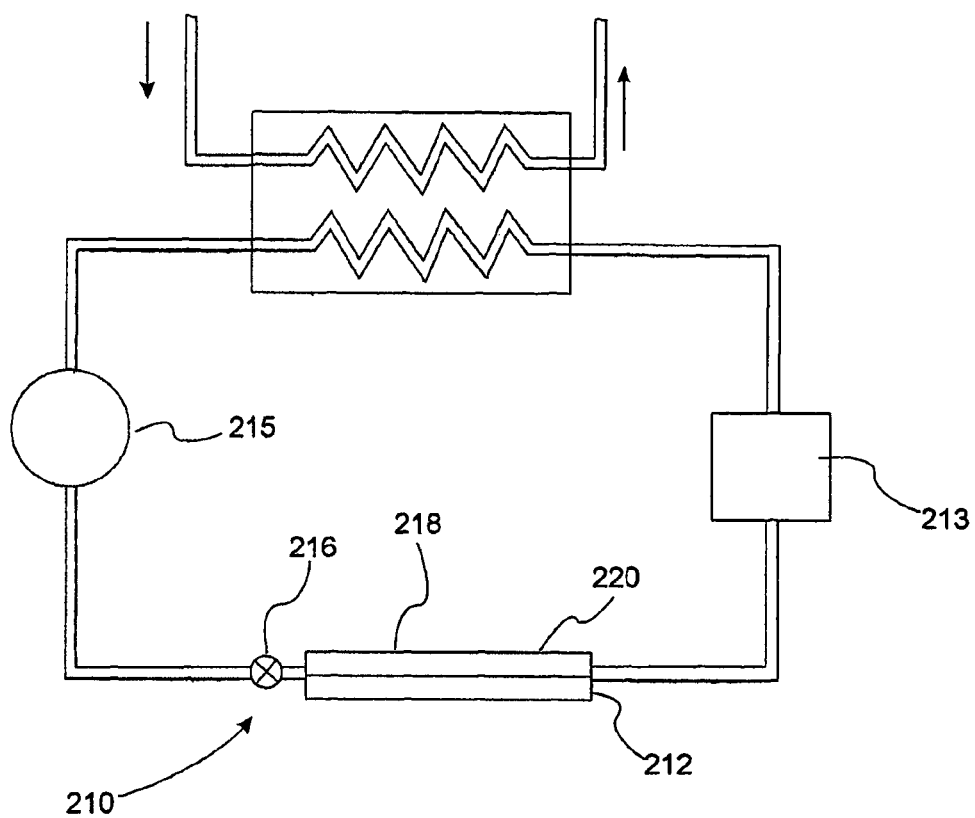
FIG. 6 is a schematic view of another cooling system for cooling a heat generating component, wherein the cooling system includes a cooling device or heat sink having a molded cooling block and a heat transfer member associated with the cooling block.

FIG. 6 shows another embodiment 210 of a cooling system for cooling a heat generating components, such as an electronic device 212. The cooling system 210 may be a phase-change cooling system, for example, and may include a compressor 213, a condenser 214, a pump 215, an expansion valve 216 and a heat sink 218 in accordance with the present disclosure.

The compressor 213 may be used to compress a cooling medium, which may be in the form of a gas or mixture of gases. For example, the cooling medium may be ethane (R-170), 1,1,1-Trifluoroethane (R-143a), or nitrogen (R-728). The compressed gas may then be routed to the condenser 214 where it is condensed into a liquid. The liquid may then be routed through the expansion valve 216, such as via pumping action of the pump 215. The liquid may then evaporate in the heat sink 218 and absorb heat from the electronic device 212.

Figure 7:
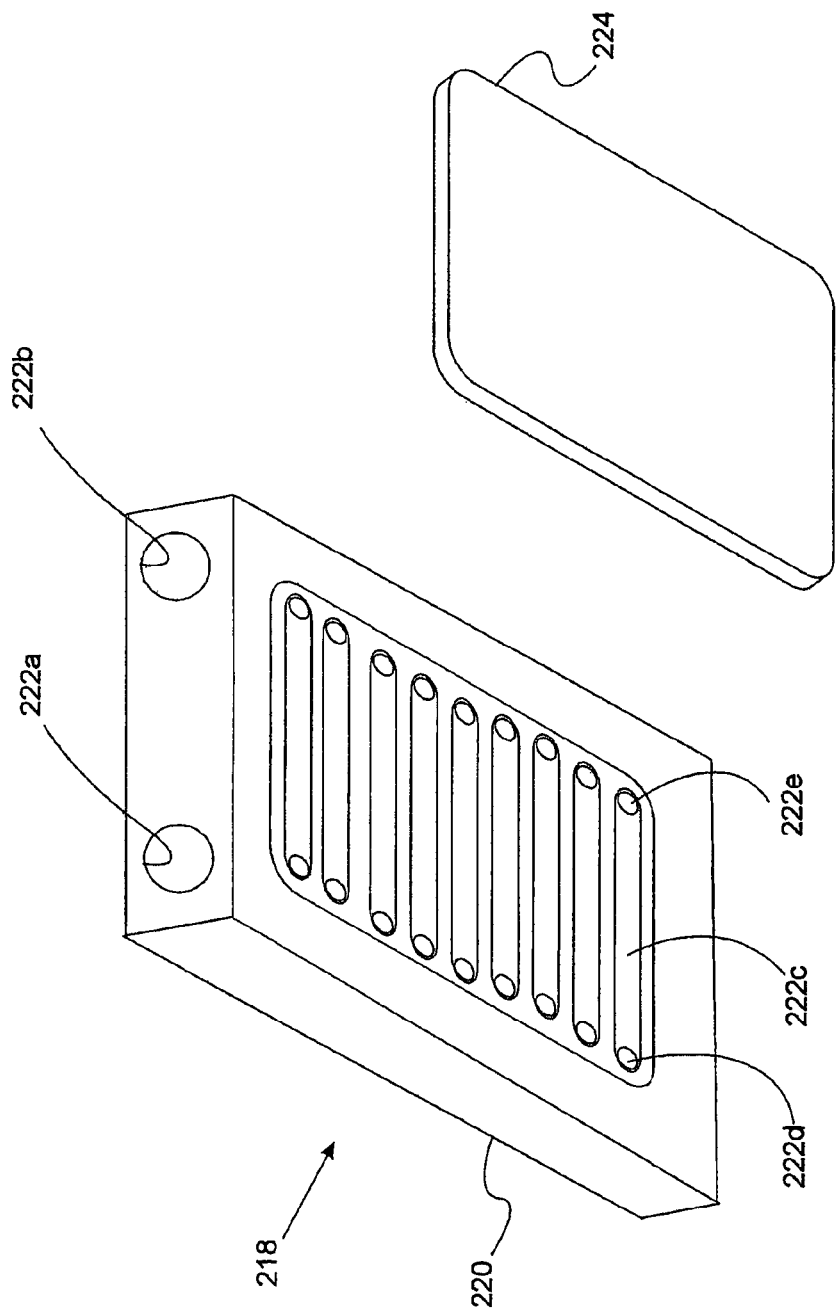
FIG. 7 is an exploded perspective view of the heat sink of FIG. 6.
Figure 8:
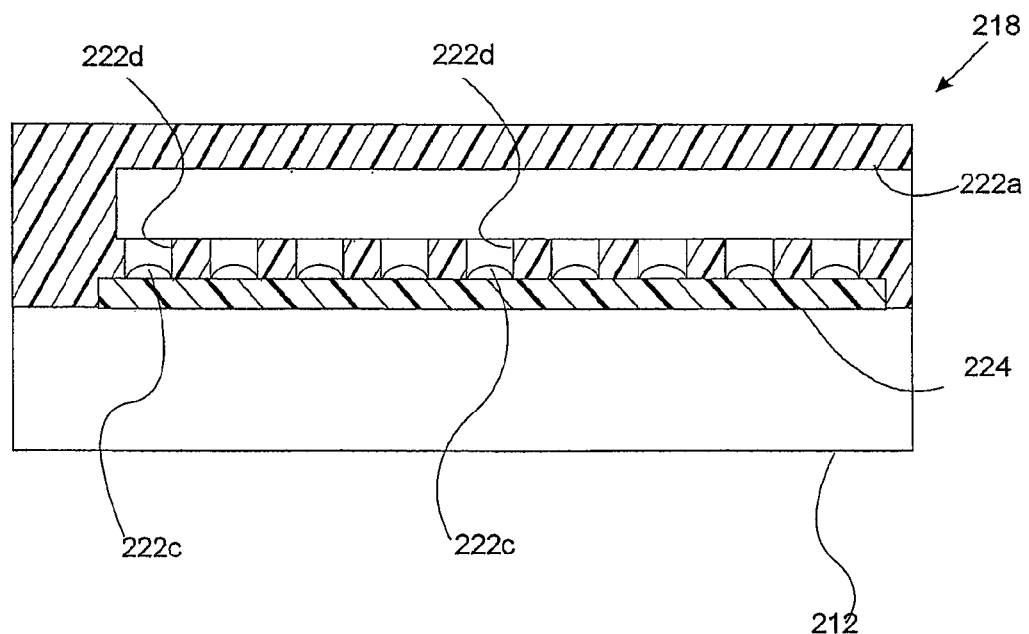
FIG. 8 is a cross-sectional view of the heat sink of FIG. 7 attached to the heat generating component shown in FIG. 6.

Referring to FIGS. 6-8, the heat sink 218 includes a molded cooling block 220 having one or more molded cooling passages 222 that receive the cooling medium. For example, the cooling passages 222 may include an inlet passage 222a, an outlet passage 222b, multiple lateral passages 222c, multiple first vertical passages 222d that connect the inlet passage 222a to the lateral passages 222c, and multiple second vertical passages 222e that connect the lateral passages 222c to the outlet passage 222b. Furthermore, the cooling block 220 is configured to be positioned in sufficient heat transfer relationship with respect to the electronic device 212 so that the cooling medium receives heat from the electronic device 212 as the cooling medium passes through the passages 222.

In the embodiment shown in FIGS. 7 and 8, the heat sink 218 also includes a heat transfer member 224, such as a heat transfer plate, attached to the cooling block 220. For example, the heat transfer member 224 may be received in a recess 226 of the cooling block 220 and may attached to the cooling block 220 with fasteners and/or adhesive. A sealing member may also be positioned between the cooling block 220 and the heat transfer member 224.

The heat transfer member 224 is closely associated with the electronic device 212 so that heat may sufficiently transfer from the electronic device 212 to the heat transfer member 224 and then to the cooling medium. For example, the heat transfer member 224 may be positioned immediately adjacent the electronic device 212, and may also be in direct contact with the electronic device 212.

Referring to FIG. 8, the heat transfer member 224 may partially define the cooling passages 222. For example, the heat transfer member 224 may define bottom portions of the cooling passages 222.

The cooling block 220 may be made of any suitable material and in any suitable manner. For example, the cooling block 220 may be made of any of the materials and by any of the methods described above with respect to the cooling block 20.

Figure 9:
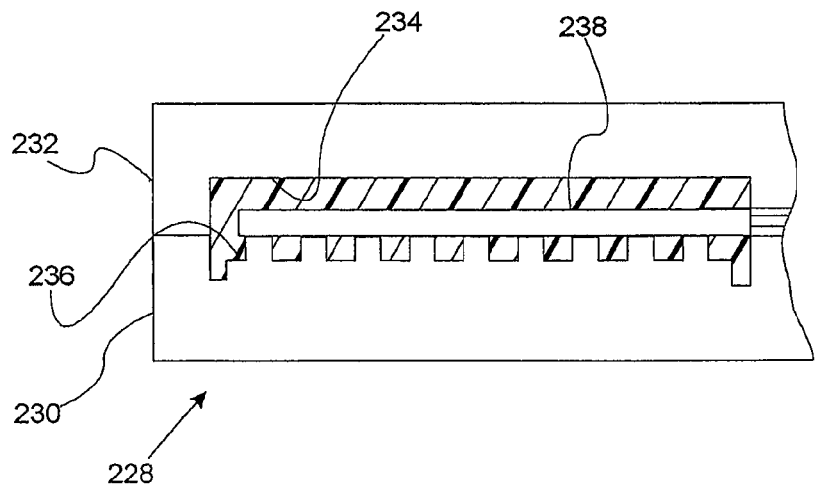
FIG. 9 is a cross-sectional view of an exemplary mold for use in making the heat sink shown in FIG. 8.

As a more specific example, the cooling block 220 may be made of injection molded plastic, or plastic composite material, using a suitable mold, such as mold 228 shown in FIG. 9. Mold 228 includes first and second mold portions 230 and 232, respectively, that may be closed together to form a cavity 234. The first mold portion 230 includes suitable projections 236 for forming the lateral passages 222*c*, the vertical passages 222*d* and 222*e*, and the recess 226. The second mold portion 232 includes movable or retractable projections 238 that are movable into the cavity 234 to form the inlet passage 222*a* and the outlet passage 222*b*. The projections 238 may also be moved out of the cavity 234 after the plastic has been introduced into the cavity to form the cooling block 220, so that the cooling block 220 may be removed from the mold 228.

The heat transfer member 224 may also be made of any suitable material and in any suitable manner. For example, the heat transfer member may be made of stamped or cast metal, such as aluminum or copper.

Because cooling blocks according to the present disclosure can be made of any suitable moldable material and with any suitable molding process, material costs and manufacturing costs can be reduced. In addition, cooling blocks with relatively complex cooling passage configurations can be efficiently and cost-effectively produced. For example, relatively dense cooling passage configurations may be readily molded into a cooling block in areas requiring significant heat transfer between the cooling block and the associated heat generating component or components. As a result, liquid cooling systems and/or phase-change cooling systems may be cost-effectively utilized in a large variety of applications.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. For example, any of the above described heat sink embodiments may be used with either a liquid cooling system or a phase-change cooling system.

What is claimed is:

1. A heat sink for use with a heat generating component, the heat sink comprising:
   a molded cooling block including a molded cooling passage form receiving a cooling medium, wherein the cooling block is configured to be positioned in sufficient heat transfer relationship with respect to the heat generating component so that the cooling medium receives heat from the heat generating component; and
   a heat transfer member sealed against the cooling block, the heat transfer member being configured to be closely associated with the heat generating component to transfer heat from the heat generating component to the cooling medium, wherein the heat transfer member partially defines the cooling passage such that the cooling passage is spaced away from the heat generating component when the heat sink is used with the heat generating component, wherein the heat transfer member is configured to directly contact the cooling medium when the cooling medium is received in the cooling passage, and the cooling passage is configured such that no cooling medium flows between the heat transfer member and the heat generating component when the heat sink is used with the heat generating component and the cooling medium is received in the cooling passage.

2. The heat sink of claim 1 wherein the cooling block comprises molded plastic.

3. The heat sink of claim 1 wherein the cooling block comprises a composite material.

4. The heat sink of claim 1 wherein the cooling block comprises molded metal.

5. The heat sink of claim 1 wherein the cooling block includes a plurality of the cooling passages, and the cooling passages include an inlet passage, an outlet passage, multiple laterally extending passages, multiple first passages that connect the inlet passage to the lateral passages, and multiple second passages that connect the lateral passages to the outlet passage, and wherein the heat transfer member partially defines each of the laterally extending passages and the heat transfer member is configured to extend between the inlet passage and the heat generating component when the heat sink is attached to the heat generating component.

6. The heat sink of claim 5 wherein the heat transfer member is configured to directly contact the cooling medium when the cooling medium is received in the laterally extending passages.

7. An electronic circuit assembly comprising:
   a circuit assembly body;
   a molded cooling clock attached to the circuit assembly body and including a molded cooling passage for receiving a cooling medium, wherein the cooling clock is positioned in sufficient heat transfer relationship with respect to the circuit assembly body so that the cooling medium receives heat from the circuit assembly body when the cooling medium is received in the molded cooling passage; and
   a heat transfer member sealed against the cooling block and positioned between the cooling block and the circuit assembly body, wherein the heat transfer member partially defines the cooling passage such that the cooling passage is spaced away from the circuit assembly body, wherein the heat transfer member is configured to directly contact the cooling medium when the cooling medium is received in the cooling passage, and the cooling passage is configured such that no cooling medium flows between the heat transfer member and the circuit assembly body when the cooling medium is received in the cooling passage.

8. The circuit assembly of claim 7 wherein the circuit assembly body includes a substrate made of a first material having a first coefficient of thermal expansion, and the cooling block is made of a second material having a second coefficient of thermal expansion that is substantially similar to the first coefficient of thermal expansion.

9. The circuit assembly of claim 7 wherein the cooling block comprises molded plastic.

10. The circuit assembly of claim 7 wherein the cooling block includes a plurality of the cooling passages, and the cooling passages include an inlet passage, an outlet passage, multiple laterally extending passages, multiple first passages that connect the inlet passage to the lateral passages, and multiple second passages that connect the lateral passages to the outlet passage, and wherein the heat transfer member partially defines each of the laterally extending passages, the heat transfer member extends between the inlet passage and the circuit assembly body, and the first passages each extend in a direction transverse to the inlet passage and the heat transfer member.

11. The circuit assembly of claim 10 wherein the heat transfer member is configured to directly contact the cooling medium when the cooling medium is received in the laterally extending passages.

12. A method for making a heat sink for use with a heat generating component, the method comprising:
    molding a material to form a cooling block that includes a molded cooling passage for receiving a cooling medium, wherein the cooling block is configured to be positioned in sufficient heat transfer relationship with respect to the heat generating component so that the cooling medium receives heat from the heat generating component when the cooling medium is received in the molded cooling passage; and
    sealing a heat transfer member against the cooling block, the heat transfer member being configured to be closely associated with the heat generating component to transfer heat from the heat generating component to the cooling medium when the cooling medium is received in the cooling passage, wherein the heat transfer member partially defines the cooling passage such that the cooling passage is spaced away from the heat generating component when the heat sink is used with the heat generating component, and wherein the heat transfer member is configured to directly contact the cooling medium when the cooling medium is received in the cooling passage, and the cooling passage is configured such that no cooling medium flows between the heat transfer member and the heat generating component when the heat sink is used with the heat generating component and the cooling medium is received in the cooling passage.

13. The method of claim 12 wherein molding the material includes injection molding plastic material to form the cooling block.

14. The method of claim 12 wherein the material comprises plastic.

15. The method of claim 12 wherein the material comprises a composite material.

16. The method of claim 12 wherein the material comprises metal.

17. The method of claim 12 wherein molding the material comprises molding the material to form the cooling block such that the cooling block includes a plurality of the cooling passages, wherein the cooling passages include an inlet passage, an outlet passage, multiple laterally extending passages, multiple first passages that connect the inlet passage to the lateral passages, and multiple second passages that connect the lateral passages to the outlet passage, and wherein the sealing step comprises sealing the heat transfer member against the cooling block such that the heat transfer member partially defines each of the laterally extending passages and such that the heat transfer member is arranged to extend between the inlet passage and the heat generating component when the heat sink is attached to the heat generating component.

18. The method of claim 17 wherein the heat sink is formed such that the heat transfer member is configured to directly contact the cooling medium when the cooling medium is received in the laterally extending passages.

* * * * *

UNITED STATES PATENT AND TRADEMARK OFFICE
CERTIFICATE OF CORRECTION

PATENT NO. : 8,422,229 B2
APPLICATION NO. : 12/491497
DATED : April 16, 2013
INVENTOR(S) : Carl T. Madison, Jr. et al.

It is certified that error appears in the above-identified patent and that said Letters Patent is hereby corrected as shown below:

In the Claims:

Column 6, Lines 4-5, Claim 1:

After "molded cooling passage" delete "form" and insert -- for --.

Signed and Sealed this
Thirteenth Day of August, 2013

Teresa Stanek Rea
*Acting Director of the United States Patent and Trademark Office*